(12) United States Patent  
Peale

(10) Patent No.: US 6,314,122 B1  
(45) Date of Patent: Nov. 6, 2001

(54) FILAMENT-BASED, OPTICAL DETECTION APPARATUS

(75) Inventor: David Reese Peale, San Diego, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/294,486

(22) Filed: Apr. 20, 1999

(51) Int. Cl.[7] .............................. H01S 5/00; H01S 3/20; H01S 3/03; H01S 3/091; H01S 3/08; G11B 7/00

(52) U.S. Cl. ........................... 372/92; 372/43; 372/44; 372/45; 372/47; 372/50; 372/49; 372/54; 372/64; 372/75; 369/121

(58) Field of Search .......................... 372/43, 44, 45, 372/50, 47, 49, 54, 64, 75; 369/121, 13; 359/154, 173; 250/552, 214.1, 214 R

(56) References Cited

U.S. PATENT DOCUMENTS 5,625,617 4/1997 Hopkins et al. .................. 369/121

OTHER PUBLICATIONS

E. Betzig et al., Near–field magneto–optics . . . , Appl. Phys. Lett., vol. 61, No. 2, pp. 142–144 (Jul. 1992).  
E. Betzig et al., Fiber laser probe . . . , Appl. Phys. Lett., vol. 63, No. 26, pp. 3550–3552 (Dec. 1993).  
M. F. C. Schemmann et al., Kink power . . . , Appl. Phys. Lett., vol. 66, No. 8, pp. 920–922 (Feb. 1995).  
M. Ohkubo et al., Experimental Study of Beam Steering . . . , Jpn. J. Appl. Phys., vol. 35, pp. L34–L36 (Jan. 1996).

Primary Examiner—Frank G. Font  
Assistant Examiner—Armando Rodriguez  
(74) Attorney, Agent, or Firm—Michael J. Urbano

(57) ABSTRACT

Optical detection apparatus comprises a solid state laser having an intracavity optical waveguide that supports a lasing filament and operates in one of two states: (1) in a first state, the filament is fixed in one of two orientations, and (2) in a second state, the filament may be induced to switch or oscillate between the two orientations, or it may be suppressed altogether. At least one feature is located on the output facet off-center with respect to the waveguide cross-section in order to provide a preferred orientation for the filament. In one embodiment, a single feature is located off-center and optical radiation of one intensity is injected through the facet feature, thereby causing the laser to operate in one of its states, whereas injected radiation of another intensity causes the laser to operate in the other of its states. The injected radiation may be radiation emitted by the laser that is reflected by an object (e.g., a bit mark in an optical storage medium or a region of an integrated circuit being viewed under an optical microscope) proximate the facet feature (e.g., in the laser near-field). Alternatively, the injected radiation may originate from a transmitter in an optical communication system. In either case, any change in the state of the laser is detected as change in a parameter of the laser (e.g., a change in its impedance that is detected as a corresponding change in its terminal voltage). In an alternative embodiment, based on a differential mode of detection, a pair of facet features are located on opposite sides of the center of the waveguide's cross-section.

17 Claims, 5 Drawing Sheets

FILAMENT-BASED, OPTICAL DETECTION APPARATUS

CROSS-REFERENCE TO RELATED APPLICATIONS

This application was concurrently filed with application Ser. No. 09/294,485 entitled *Self-Modulated, Filament-Based, Solid state Laser* (Peale 10).

FIELD OF THE INVENTION

This invention relates to optical detection apparatus and, more particularly, to near-field optical apparatus, such as optical storage apparatus, optical microscopes and optical receivers.

BACKGROUND OF THE INVENTION

In the context of optical storage and optical microscopes, U.S. Pat. No. 5,265,617 granted on Apr. 27, 1997 to L. C. Hopkins et al. (hereinafter referred to as Hopkins) describes near-field optical detection apparatus that includes a semiconductor laser having a non-uniform emission face (e.g., output facet) configured so that at least 50% (preferably 90–95% of the total radiation emission from the output facet is emission from a first region having a width $w<\lambda_s$, where $\lambda_s$ is the center wavelength of the laser emission at the output facet. Illustratively, the emission face has a coating thereon, and an aperture, recess, protrusion or other structural feature (hereinafter referred to as a feature) is formed in the coating. Alternatively, as pointed out at column 7, line 59–67, the feature may be formed directly in an (uncoated) output facet. Depending on the relative reflectivity of the feature compared to the surrounding areas of the facet, the first region may be located either at the feature or in the surrounding area. Hopkins contemplates embodiments with both edge-emitting semiconductor lasers (e.g., ridge waveguide lasers) and surface-emitting semiconductor lasers (e.g., VCSELs). This patent is incorporated herein by reference.

As noted at column 6, lines 55–57 of Hopkins, it is typically desirable to position the feature (e.g., a recess in the output facet coating) substantially in the center of the active region of the laser. In the case of edge-emitting ridge waveguide lasers, this desideratum means that the feature is typically positioned at the center of the cross-section of the waveguide.

The utilization of such a laser to read information contained at the data sites (i.e., bit marks) of a storage medium is described by Hopkins at column 10, lines 32–67. Briefly, variations in the reflection properties of the data sites result in variations in at least one laser parameter (e.g., laser optical output intensity, and/or laser terminal voltage). In an exemplary embodiment, these variations in the radiation reflected by the data sites back into the laser result in corresponding variations in the intensity of radiation emitted from the back facet of the laser, which can be detected in conventional fashion by means of a photodetector. Alternatively, the Hopkins optical storage apparatus may be operated in a transmission mode as shown and described with reference to FIG. 11 therein.

The Hopkins laser and optical storage apparatus do not, however, rely on the laser operating in multiple transverse modes, and in particular, do not exploit optical filaments formed by the coupling of such transverse modes to one another.

With respect to solid state lasers that include a planar optical waveguide, the term filament as used herein means an intracavity, in-plane (i.e., in the plane of the waveguide) intensity distribution of the lasing radiation that exhibits a meandering (e.g., sinusoidal) pattern of nodes and peaks that weaves from one side of the waveguide cross-section to another (or from the top to the bottom of the waveguide cross-section) along the longitudinal axis of the laser. A few prior art lasers have exhibited such filaments; e.g., 0.98 μm pump laser diodes and 1.3 μm buried heterostructure (BH) laser diodes investigated by Ohkubo et al., *Jpn. J Appl. Phys.*, Vol. 35, pp. L34-L36 (1996) and Schemmann et al., *Appl. Phys. Lett.*, Vol. 66, No. 8, pp. 920–922 (1995), both of which are incorporated herein by reference. But prior art workers have considered filamentation in these lasers to be undesirable because the maximum useful output power is limited by the lateral beam deflection that occurs when the filament forms. In addition, the authors did not appreciate the way such filaments might be used in optical detectors.

On the other hand, in the context of optical receivers for use, for example, in optical communication systems, information (e.g., data, voice, video) carried on a laser beam is typically detected by a p-i-n photodiode. In such devices absorption of the laser beam in the i-region generates electron-hole pairs. Under reverse bias electrons and holes swept out of the i-region generate a photocurrent that corresponds to the intensity of the laser beam (e.g., to the intensity of the pulses in a digital system). The maximum speed (i.e., data rate in a digital system) at which the system can operate is determined, in part, by how fast carriers can be swept out of the i-region of the photodiode. Typically the maximum speed is on the order of a few 10s of GHz.

There is a need in the optical communications systems industry, however, for systems and hence photodetectors that can operate at much higher speeds; e.g., on the order of 100s of GHz.

SUMMARY OF THE INVENTION

In accordance with one aspect of the invention, optical detection apparatus comprises a solid state laser having an intracavity optical waveguide that supports a lasing filament and operates in one of two states: (1) in a first state, the filament is fixed in one of two orientations, and (2) in a second state, the filament may be induced to switch or oscillate between the two orientations, or it may be suppressed altogether. At least one feature is located on the output facet off-center with respect to the waveguide cross-section in order to provide a preferred orientation for the filament. In one embodiment, a single feature is located off-center and optical radiation of one intensity is injected through the facet feature, thereby causing the laser to operate in one of its states, whereas injected radiation of another intensity causes the laser to operate in the other of its states. The injected radiation may be radiation emitted by the laser that is reflected by an object (e.g., a bit mark in an optical storage medium or a region of an integrated circuit being viewed under an optical microscope) proximate the facet feature (e.g., in the laser nearfield). Alternatively, the injected radiation may originate from a transmitter in an optical communication system. In either case, any change in the state of the laser is detected as change in a parameter of the laser (e.g., a change in its impedance that is detected as a corresponding change in its terminal voltage).

In an alternative embodiment, based on a differential mode of detection, a pair of facet features are located on opposite sides of the center of the waveguide's cross-section. When optical radiation is injected essentially simultaneously into each of the features, the laser again operates in one of two possible states: (1) in a first state, the filament is stable if the two injected signals have substantially different intensities, and (2) in a second state, the filament switches (or oscillates) between different orientations, or it may be suppressed altogether. As with the first embodiment, a parameter of the laser has different values in these two states, which enables radiation signals of different intensities to be detected and differentiated from one another. Also similar to the first embodiment, the injected radiation may come from a reflecting object, or it may originate from a transmitter in an optical communication system.

BRIEF DESCRIPTION OF THE DRAWING

The invention, together with its various features and advantages, can be readily understood from the following more detailed description taken in conjunction with the accompanying drawing, in which.

Figure 5:
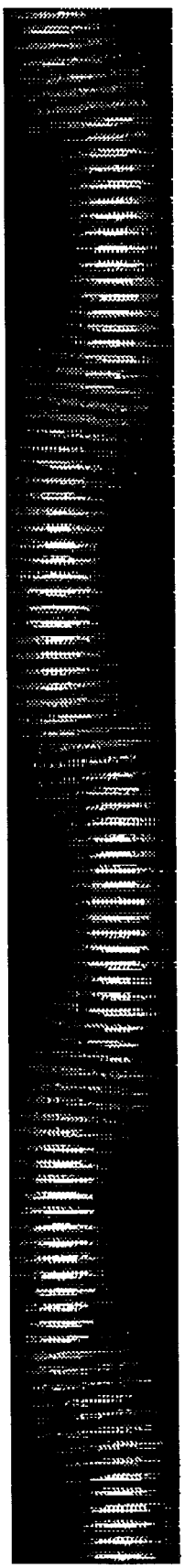
FIG. 5 is a computer simulation of an optical filament formed by the coupling of different transverse modes having the same frequency in a planar waveguide; i.e., this figure is a top view showing the intracavity, in-plane intensity distribution of the coherent superposition of coupled $TE_{00}$ and $TE_{01}$, modes within the waveguide core. When the laser includes an appropriate mode-mixing mechanism of the type discussed hereinafter, this pattern is stationary with respect to the waveguide's longitudinal boundaries. In this figure, and for purposes of illustration only, the electric field strength of the $TE_{01}$, mode is 75% that of the $TE_{00}$ mode.
Figure 6:
Figure 7:
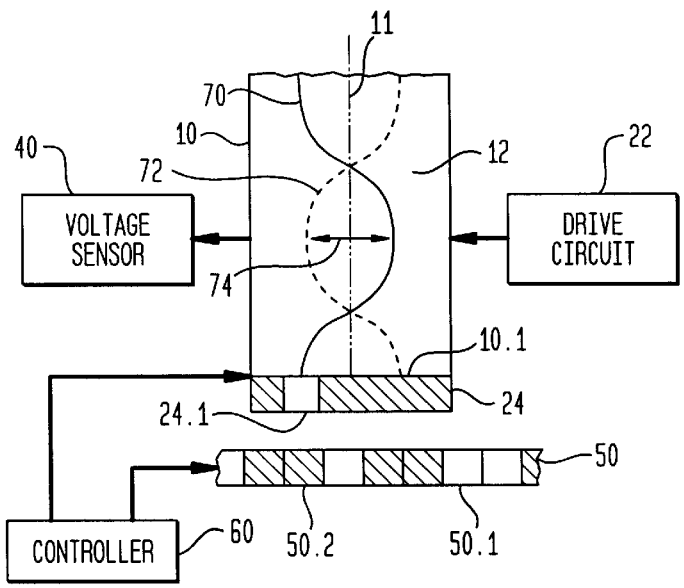
Figure 8:
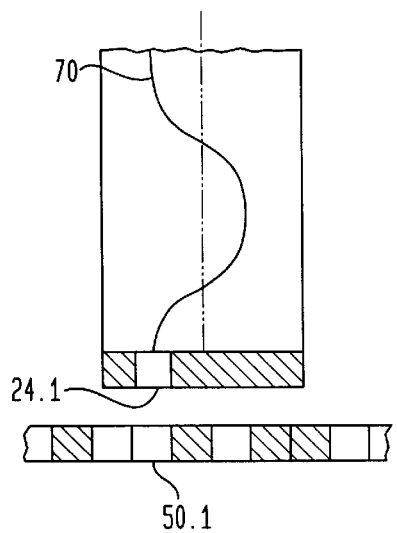
Figure 9:
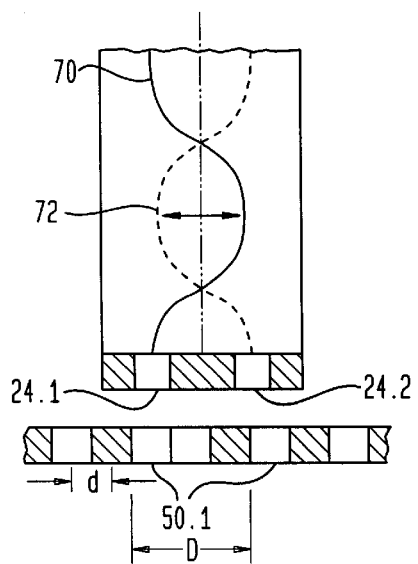
Figure 10:
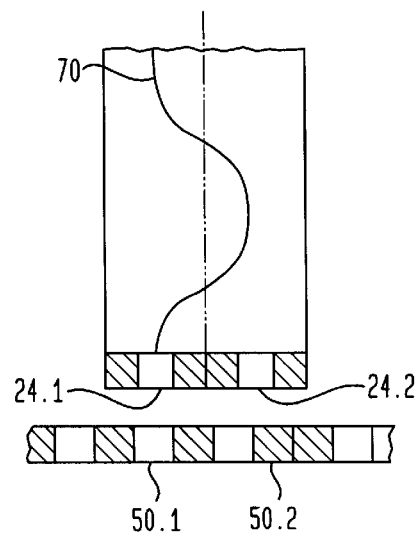

Other percentage relationships are feasible in which cases the filament will still have a meandering shape but it will differ in detail from that shown in this figure. (See, for example, FIG. 6.) The dimensions of the figure are not to scale. In particular, the effective refractive index difference between the $TE_{00}$ and $TE_{01}$ modes has been exaggerated so that they differ by 5%, thereby allowing the optical fringes and the beat period of the filament to be captured in a single photo image. For this laser design the transverse dimension, which corresponds to the waveguide width, is typically about 1.5 $\mu$m, and the longitudinal period of the filament beat is approximately 70 $\mu$m;

FIG. 6 is a computer simulation similar to that of FIG. 5 but for the case where the electric field strength of the $TE_{01}$ mode is 150% of the electric field strength of the $TE_{00}$ mode;

FIGS. 7 and 8 are schematic, block-diagrammatic views of near-field optical storage apparatus in accordance with one embodiment of the invention;

FIGS. 9 and 10 are schematic, block-diagrammatic views of near-field optical storage apparatus in accordance with another embodiment of the invention based on a differential mode of detection.

In the interest of clarity and simplicity, FIGS. 1–3 and 7–10 have not been drawn to scale.

DETAILED DESCRIPTION OF THE INVENTION

In general optical detection apparatus in accordance with the invention is useful in a number of applications in which there is a need to differentiate between objects of different reflectivity or optical signals of different intensity. As mentioned earlier, such applications include optical storage apparatus, optical microscopes and optical receivers. In the interest of simplicity, however, the following discussion is directed to only two of these applications, without intending to limit the scope or variety of applications that those skilled in the art will find suitable for utilization in conjunction with various embodiments of the invention.

Optical Storage Apparatus

With reference now to FIGS. 7–8, optical storage apparatus is shown schematically to include a solid state (e.g., semiconductor) laser 10 that includes an intracavity optical waveguide 12 that has a longitudinal axis 11. Typically axis 11 is coincident with the corresponding axis of a cavity resonator formed by a pair of parallel surfaces (e.g., a front facet 10.1 and a back facet, not shown). A coating 24 is formed on the front facet 10.1, and at least one aperture, recess, protrusion or other structural feature (hereinafter a feature) 24.1 is formed in the coating. The feature is positioned off-center relative to the axis 11. The laser and coating structures are described more fully in the next sections.

Drive circuit 22 provides pumping current that energizes the laser and causes it to generate lasing radiation a portion of which emerges from feature 24.1. Sensor 40 senses changes in a parameter of the laser, illustratively its terminal voltage, induced by objects that are proximate the feature. In this application, the objects are bit marks in an optical storage medium 50. Here the bit marks are illustrated as being of two types: unshaded bit marks 50.1 having a first reflectivity (representing, for example, logic 1 in a digital data coding scheme), and shaded bit marks 50.2 having a second reflectivity (representing, for example, logic 0 in the same coding scheme). Illustratively, the first reflectivity is higher than the second reflectivity. A controller controls the position of the laser and/or the medium relative to one another so that the bit marks are sequentially brought into registration with the feature. Illustratively, the storage medium is a rotating disk, and the controller moves a read head, that includes the laser, over the disk to read the bit marks. Typically the storage medium is close enough to the output facet that the bit marks are within the near-field of the laser, as defined in the Hopkins patent, supra.

In accordance with one aspect of the invention, the intracavity laser radiation is characterized by a lasing filament that has two possible orientations within the waveguide; e.g., as shown in FIG. 7, the filament may have the orientation depicted by the sinusoidal solid line 70, or it may have the orientation depicted by the sinusoidal dashed line 72. In accordance with another aspect of the invention, the laser 10 may be forced to operate in one of two states: (1) in a first state, the filament is fixed in one of its two orientations, as shown in FIG. 8, or (2) in a second state, the filament may be induced to switch or oscillate between the two orientations, as shown by the horizontal arrow 74 in FIG. 7, or it may be suppressed altogether. More specifically, a filament prefers in general to having its starting point (where it intersects the output facet) at a region of reflectivity different from that of the surrounding regions of the output facet. (A reflectivity difference of only 5–10% may be sufficient depending on the particular laser utilized.) However, if all regions of the facet have comparable reflectivity, then the filament has no preferred starting point; i.e., a degenerate condition exists in which the filament finds either of its orientations equally likely. (If all regions of the facet have essentially identical reflectivity, then the filament will be suppressed.) In this condition the filament switches between the two orientations. In contrast, if the facet coating has a feature with reflectivity sufficiently different from that of surrounding areas of the facet, then the filament will prefer to fix its starting point on either the feature or the surrounding region, whichever has higher reflectivity.

The reflectivity of a bit mark adjacent (e.g., in registration with) the feature, in turn, affects the state of the laser as follows. The laser radiation that emerges from the feature is partially reflected and partially absorbed by the bit mark. Therefore, the reflectivity and absorptivity of the bit mark determines, in part, how much of the reflected radiation is injected back into the laser through the feature. From a total reflectivity standpoint, therefore, the laser filament sees the bit mark effectively as a part of the output facet. For example, as shown in FIG. 7, a shaded, relatively low reflectivity bit mark 50.2 is positioned adjacent the feature 24.1. The absolute reflectivity of the bit mark is designed so that the combined reflectivity of the feature and the bit mark 50.2 as seen by the filament is comparable to that of the surrounding areas of the output facet. In this case, the filament will switch back and forth between orientations 70 and 72, as shown by the arrow 74 in FIG. 7, or the filament will be suppressed altogether if the combined reflectivity is essentially equal to that of the surrounding areas. On the other hand, as shown in FIG. 8, an unshaded, relatively high reflectivity bit mark 50.1 is positioned adjacent the feature 24.1. The absolute reflectivity of the bit mark is designed so that the combined reflectivity of the feature and the bit mark 50.2 as seen by the filament is substantially different from that of the surrounding areas of the output facet. In this case, the filament prefers a single, fixed orientation 70 with its starting point on the higher reflectivity region of the facet; e.g., on the feature in the illustrative embodiment shown in FIG. 8.

At least one of the parameters of the laser changes its value depending on the state in which the laser operates. These parameters include, for example, the laser impedance (which is reflected in its terminal voltage) and the intensity of the laser back face emission. In the former case, the impedance is lower in the second state than in the first. Thus, sensor 40 detects these changes and thereby senses the state in which the laser is operating. As pointed out earlier, in the laser's second state the filament may either be switching between its two orientations, or it may be suppressed altogether. However, the time-average of the laser impedance during filament switching is substantially the same as the impedance during filament suppression. Since the sensor cannot distinguish between these two, they are grouped as a single state.

In an alternative embodiment of the invention based on a differential mode of detection, as shown in FIGS. 9–10, the coating on the output facet of the laser has a pair of features 24.1 and 24.2 positioned on opposite sides of the axis 11. Although the features are shown to be symmetrically located in the schematic representation of FIGS. 9–10, such symmetry is not essential. Preferably, however, the features are laterally spaced from one another by a distance D=nd, where d is the distance between adjacent bit marks and n is an integer. The case of n=3 is depicted in FIGS. 9–10 for purposes of illustration only. The controller brings two features into registration with the two bit marks at essentially the same time.

In operation, with the laser in a first state, the filament rapidly switches (or oscillates) between its two orientations whenever the two bit marks have the same reflectivity (e.g., both are logic 1, unshaded bit marks or both are logic 0, shaded bit marks). FIG. 9 illustrates the former situation; two unshaded bit marks 50.1 are positioned opposite features 24.1 and 24.2, respectively, and the filament switches between its two possible orientations 70 and 72. In contrast, FIG. 10 illustrates the case where a higher reflectivity bit mark 50.1 is positioned adjacent feature 24.1, whereas a lower reflectivity bit mark 50.2 is positioned adjacent feature 24.2. In this case the filament sees a higher total reflectivity at feature 24.1 and therefore chooses fixed orientation 70. Of course, if the bit marks were interchanged, the filament would chose a fixed orientation corresponding to 72 instead.

General Laser Structure

Figure 1:
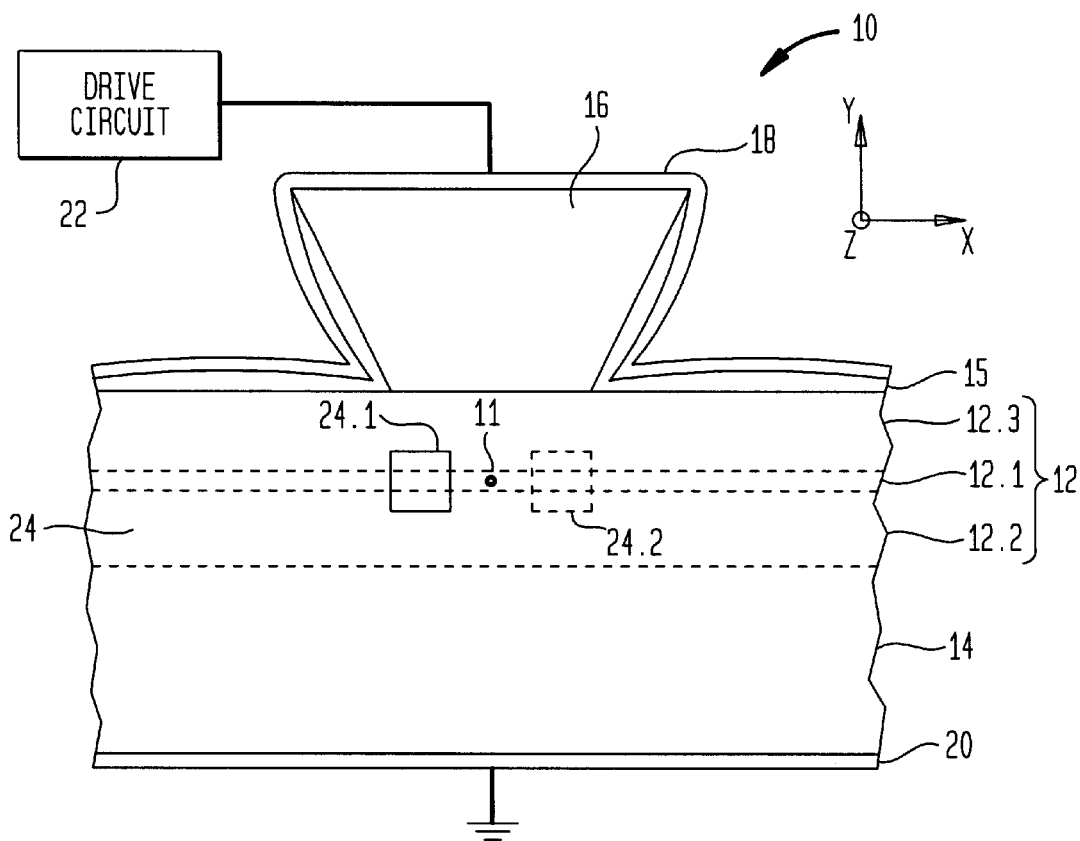
FIG. 1 is a schematic, end view of a ridge waveguide semiconductor laser for use in filament-based optical detection apparatus in accordance with one embodiment of the invention.

This section describes various filament-generating semiconductor lasers useful in the foregoing optical storage and other optical detection apparatus. With reference to FIG. 1, a semiconductor laser 10 comprises an optical waveguide 12 that includes an active region 12.1 sandwiched between upper cladding region 12.3 and lower cladding region 12.2. The active region serves as the core of the waveguide, which illustratively is planar. (Alternatively, the active region could be located outside a waveguide but optically coupled thereto.) The lower cladding region is formed on a single crystal semiconductor body 14. Alternatively, the body itself may serve as the lower cladding in which case the layer 12.2 may be omitted. Body 14 typically includes a semiconductor substrate or a combination of such a substrate with another layer (e.g., an epitaxial layer grown on the top surface of the substrate).

The term region is intended to embrace a single layer, multiple layers or partial layers. The active region in particular may be a single layer as in a standard double heterostructure (DH), or it may include multiple layers as in multi-quantum well (MQW) lasers or quantum cascade (QC) lasers. Illustratively, lasers of this type are fabricated from Group III-V compound semiconductors; e.g., GaAs-based compounds such as GaAs/AlGaAs (for operation at about 0.7–1.0 μm), In-based Group III-V compounds such as GaAs/InGaAs (for operation at about 1.0 μm), InP/InGaAsP (for operation at about 1.3–1.55 μm) and GaInAs/AlInAs (for operation at 3–17 μm in QC lasers).

The laser may be pumped either optically or electrically, although the latter is more typical and currently suited to more practical applications. The most common form of electrical pumping is to supply current via drive circuit 22 to the laser under forward bias conditions; i.e., the cladding regions typically have opposite conductivity types, and the forward bias would be applied across electrodes 18 and 20. In order to constrain the applied current to flow in a relatively narrow channel across the active region, the laser may be designed to have, for example, a stripe geometry, a ridge waveguide geometry, a buried heterostructure (BH) geometry, or any of several other designs also well known in the art. A ridge waveguide design is illustrated in FIG. 1. Here, a ridge 16, in the shape of an inverted trapezoid, is disposed adjacent cladding region 12.3. Electrode 18 makes electrical contact with the top of ridge 16 but is electrically insulated from other parts of the top surface of the laser by means of insulating layer 15 (e.g., $SiO_2$).

As is well known in the art, the ridge may be etched or otherwise shaped from, or it may be formed on, the upper cladding region. A stop-etch layer (not shown) may be interposed between the ridge and the cladding to facilitate the etching process. Another alternative is to form the ridge as a non-inverted trapezoid (e.g., a mesa), as in the laser described by Hopkins, supra.

When the applied current exceeds the lasing threshold, the active region generates coherent, stimulated emission of radiation at a wavelength approximately determined by the bandgap of the active region in the case of standard semiconductor lasers or by the thickness of the quantum wells in QC lasers. When provided with optical feedback the device functions as a laser. This feedback is typically supplied by an optical cavity resonator formed, for example, by cleaved crystal facets (with or without suitable coatings), distributed feedback (DFB) gratings, distributed Bragg reflectors (DBRs), or a combination of them. In the laser depicted in FIG. 1, the resonator is formed by cleaved crystal facets that are oriented perpendicular to the longitudinal resonator axis (z-axis).

Figure 2:
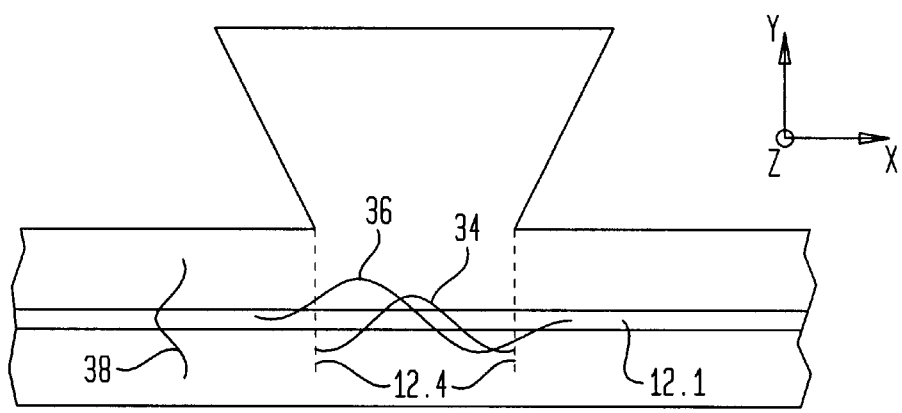
FIG. 2 is a schematic, end view of a ridge waveguide semiconductor laser useful in distinguishing transverse mode components 34 and 36, which are, respectively, fundamental and first order mode components parallel to the plane of the waveguide (x-z plane), from mode component 38, which is a fundamental mode component perpendicular to the plane of the waveguide. Depending on the thickness of the waveguide and the refractive index of the waveguide materials, the laser could also support higher order mode components perpendicular to the plane of the waveguide. The transverse modes may be either transverse electric (TE) modes which are polarized parallel to the plane of the waveguide, or they may be transverse magnetic (TM) modes which are polarized perpendicular to the plane of the waveguide. For simplicity the following discussion will focus on TE modes and will use the standard notation $TE_{nm}$ to designate that the mode is of order n perpendicular to the plane of the waveguide and of order m parallel to the plane of the waveguide. For example, the notation $TE_{00}$ designates a transverse electric mode of fundamental order (n=0) perpendicular to the plane of the waveguide and of fundamental order (m=0) parallel to the plane of the waveguide. Likewise, the notation $TE_{01}$ designates a transverse electric mode of fundamental order (n=0) perpendicular to the plane of the waveguide and of first order (m=1) parallel to the plane of the waveguide.

The stimulated emission in the waveguide is also characterized by transverse electric mode components 34, 36 and 38 depicted schematically in FIG. 2 as lying in the x-y plane. Mode components 34 and 36 are fundamental and first order mode components, respectively, parallel to the plane of the waveguide, whereas mode component 38 is a fundamental mode component perpendicular to the plane of the waveguide. In the case of mode components polarized parallel to the plane of the waveguide, mode components 38 and 34 taken together represent a $TE_{00}$ mode, and mode components 38 and 36 taken together represent a $TE_{01}$ mode.

A coating 24 having a recess, aperture, protrusion or other structural feature (e.g., 24.1, 24.2 or both) is formed on one facet of the laser for purposes of mode mixing, as described in the next section. The feature is positioned relative to the center of the cross-section of the waveguide (or equivalently relative to the longitudinal axis of the cavity resonator) so as to control filament switching, also as discussed previously and in the next section. The other facet may be left uncoated, or it too may be coated. The laser output may be extracted from either facet or both facets.

Mode Mixing

In accordance with one aspect of the invention, the laser 10 is designed so that the waveguide core (i.e., active region 12.1) is wide enough to support multiple TE mode components parallel to the plane of the waveguide, although typically the core is thin enough to support only a single TE mode component perpendicular to the plane of the waveguide. In the ridge waveguide laser design of FIGS. 1 & 2, the width of the waveguide is defined primarily by the width of the bottom of the ridge 16 (e.g., approximately by the vertical, dashed lines 12.4 of FIG. 2). For Group III-V compound lasers operating at a center wavelength of about 1 μm, the width of the bottom of the ridge should be about 1.5 μm or greater. The calculations used to determine the appropriate width for a particular laser design are well known in the art.

Another aspect of the invention is the provision for transverse mode mixing; that is, a mechanism that couples transverse modes to one another in such a way that energy is transferred between modes without allowing one transverse mode to dominate to the exclusion of other transverse modes (as is the case in standard solid state lasers that do not have a mode mixing mechanism). Thus, lasers in accordance with the invention operate simultaneously in multiple transverse modes. The mixed transverse modes then become the true eigen modes of the cavity resonator.

Mode mixing by means of a scattering center is depicted in FIG. 1 Here, a laser facet is provided with a coating 24, and a feature (e.g., 24.1, 24.2 or both) is formed in the coating illustratively by focused ion beam (FIB) etching as described in Hopkins, supra. In part, the feature serves as a scattering center that provides the desired mode mixing, and as a side effect also lowers the Q of the resonator. Illustratively, the coating includes a multiplicity of dielectric layers (e.g., layers of $Al_2O_3$, $Zr_2O_3$ and/or $Si_3N_4$), or it may also include a multiplicity of conductive layers (e.g. metal layers such as Ti, Al and/or Au) formed on the dielectric layers. The precise combination of materials and layer thicknesses is determined primarily by the desired reflectivity of the feature and the surrounding area of the facet, as is well known in the art. Illustratively, the feature is formed in one or more of the outermost layers of the coating. In filament-based optical detection applications, the coating is designed so that the feature reflectivity is different from that of the surrounding areas of the coating. As pointed out in the next section, an optical filament tends to intersect the facet (i.e., the filament has its starting point) in a region of relatively higher total reflectivity, taking into account the actual reflectivity of the facet region and the effective reflectivity of the object proximate the facet feature, which in part is determined by the actual reflectivity of the object and the amount of reflected light that is coupled (injected) back into the laser.

As mentioned previously, when the laser employs a single feature 24.1 or 24.2, it is located off center relative to the x-y cross-section of the waveguide of the laser (or equivalently relative to the longitudinal axis of the resonator). Likewise, when the laser employs a pair of features 24.1 and 24.2, they are located on opposite sides of the center of the waveguide crosssection (although they need not be positioned symmetrically with respect to that center). The features may take on a variety of shapes, e.g., square features shown in FIG. 1 or rectangular features (not shown).

Positioning the Feature

In general, a filament prefers to start in an area of the facet that has relatively higher reflectivity than surrounding areas of the facet; i.e., a filament prefers to start at a facet feature if the laser is designed so that feature has higher reflectivity than surrounding areas. In filament-based optical detection apparatus in accordance with the present invention, as discussed previously, the relevant reflectivity includes not just the reflectivity of the facet coating and the feature itself, but also the reflectivity of any objects that the laser filament sees in the near-field of the laser output.

Consider first the case of a single feature positioned on the output facet at the at the center of the cross-section of the waveguide. With the feature on-center the sinusoidal filament may take on one of two possible orientations represented by $+x_o\sin(k_z z)$ or $-x_o\sin(k_z z)$, where x is the position (parallel to the waveguide layers) of the peak intensity of the filament as a function of the z-position along the longitudinal axis of the waveguide. Since these orientations are nominally equivalent and equally likely (i.e., degenerate), the filament is free to switch back and forth between them depending on the conditions or perturbations favoring one or the other. For example, this switching may take place as the filament intensity builds up, thereby saturating the gain along the filament's path length. The gain along the alternate orientation then becomes larger, and the filament reforms in that orientation. The switching time corresponds to the linewidth of one of the frequency components (i.e., the longitudinal modes of the laser output). The switching of the filaments is exploited in the present invention, as discussed previously.

This switching can be inhibited, with a concomitant lengthening of the coherence time, by eliminating the degeneracy between the two filament orientations; e.g., by locating the feature off-center. In this case, the filament takes on a cosine-like dependence originating from either the feature or the surrounding area of the facet (depending on which one is designed to have the higher reflectivity). Since one side of the facet has a larger modal reflectivity, the filament does not find it favorable to flip to the alternate cosine orientation even when the gain saturation sets in as the filament intensifies late in its buildup phase.

Filament Formation and Beating

In accordance with this aspect of the invention, the mixing of transverse modes as described above leads to the formation of an optical filament (e.g., FIG. 5). In summary, at least two different transverse modes at the same frequency (e.g., $\omega_1$) couple (i.e., spatially beat) to form an optical filament. Alternatively, two different transverse modes at another frequency (e.g., $\omega_2$) might couple (i.e., spatially beat) to form an optical filament. Illustratively, the $TE_{00}$ mode and the $TE_{01}$ mode are the two different transverse modes, and their components (e.g., 34 and 36, FIG. 2) parallel to the plane of the waveguide couple with one another. However, higher order TE mode components may also be involved in this process. Alternatively, if the waveguide is made thick enough to support higher order TE mode components perpendicular to the plane of the waveguide, yet narrow enough to support only the fundamental mode TE mode component parallel to the plane of the waveguide, then the TE mode components perpendicular to the plane of the waveguide may also couple to one another to form a filament. In this case, the filament would exhibit an in-plane intensity distribution of nodes and peaks that would meander from the top to the bottom of the waveguide cross-section, rather than from side to side. Likewise, it may also be possible that transverse magnetic (TM) mode components (either parallel or perpendicular to the plane of the waveguide) may be made to couple with one another to form an optical filament.

Figure 4:
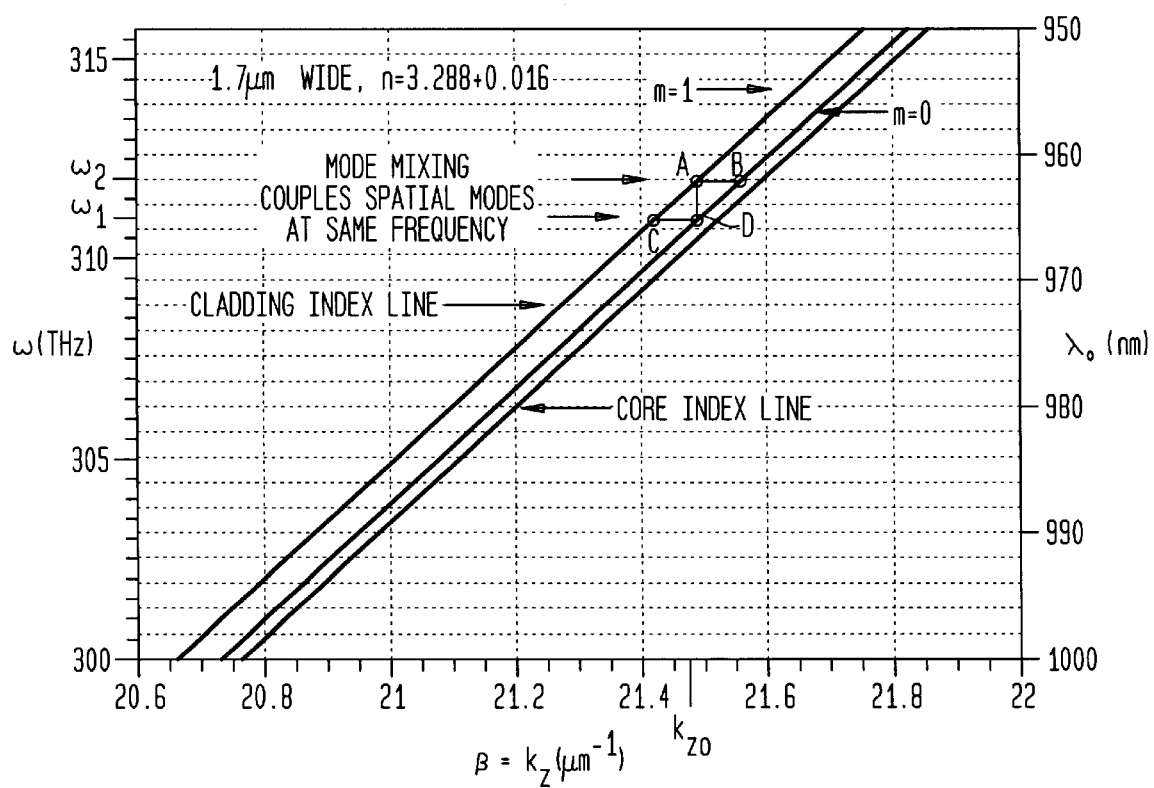
FIG. 4 a graph of waveguide dispersion useful in understanding how the mixing of TE modes forms a filament in accordance with one embodiment of the invention $\lambda_o$ is the free-space wavelength, and $k_z$ is the propagation constant as measured in the waveguide.

To understand filament formation more fully, consider FIG. 4 which shows the dispersion of a waveguide which is 1.7 um wide (e.g., the dimension of the bottom of ridge 16) and has an effective refractive index 3.288+0.016 (typical of InGaP having a mole fraction of about 0.18–0.20 In) under the ridge 16. Outside the ridge 16 the effective refractive index is 3.288 (typical of a composite of InGaP and $SiO_2$). Also shown are the dispersion of the $TE_{00}$ mode (labeled m=0) and the $TE_{01}$ mode (labeled m=1). The principles discussed are applicable, however, to waveguides having other dimensions and refractive indices, and to higher order transverse modes, as long as the waveguide supports a multiplicity of transverse modes.

In FIG. 4 the two different waves (transverse modes) that interact within the laser waveguide are labeled A & B. In this illustration, A & B are $TE_{01}$, and $TE_{00}$ modes, respectively, both having a frequency $\omega_2$. Because the two transverse modes at this frequency have different propagation velocities, a spatial beat pattern appears. In the case of the $TE_{01}$, and $TE_{00}$ modes, the beat pattern is a sinusoidal filament of the type shown in FIG. 5. Alternatively, or in addition, a different pair of $TE_{01}$ and $TE_{00}$ modes, C & D, respectively, may couple together (i.e., spatially beat) to form a separate filament at a lower frequency $\omega_1<\omega_2$. However, only one filament is necessary for the operation of optical detection apparatus in accordance with the invention.

In order to insure that two TE modes at the same frequency will spatially beat to form an optical filament, their relative electric field strengths should preferably be maintained within a suitable range. Take, for example, the coupling of $TE_{00}$ and $TE_{01}$ modes. Computer simulations, applicable to a variety of laser designs, indicate that the $TE_{01}$ field strength needed to form a filament useful in optical detection may be about 1–200% (or more) of the $TE_{00}$, field strength. More specifically, computer simulations of the type depicted in FIGS. 5 & 6 indicate that filament formation is fairly well pronounced even when the $TE_{01}$ field strength is relatively low; e.g., 1% of the $TE_{00}$ field strength. As the relative field strength of the $TE_{01}$ mode increases above about 50%, the filament becomes more and more pronounced laterally (e.g. FIG. 5). Eventually (e.g., between about 100–200%) a loss of intensity in the filament as it crosses the longitudinal axis becomes increasingly apparent and causes the filament to look less sinusoidal and more cusp-like (i.e., cusp-shaped groups of optical fringes). Even under these circumstances, however, it is expected that the filament is still useful for optical detection. In the prior art understanding of laser operation, it appears that researchers did not appreciate how such relatively large $TE_{01}$ field strengths arise given the reduced gain and increased losses of the higher order transverse modes and the modal gain competition with the fundamental transverse mode. In the present invention these requisite, relatively high $TE_{01}$ field strengths are realizable, as discussed below, and lead to the formation of useful filaments.

In general, the intensities of the transverse modes are controlled by two principal effects: (1) the design of the waveguide, and (2) the diffraction of one mode into another (e.g., the $TE_{00}$ mode into the $TE_{01}$, mode). With respect to waveguide design, the width of the core (i.e., approximately the width of the ridge in the case of ridge waveguide lasers) should be large enough that the higher order transverse mode is not too close to cut off. For simplicity, let us assume in the remainder of this discussion that the higher order mode is a $TE_{01}$ mode. Said another way, there should be sufficient overlap between the $TE_{01}$ mode and the core that both the $TE_{00}$ mode and the $TE_{01}$ mode experience sufficient gain to support lasing of the coupled modes (even though the $TE_{01}$, mode will have less gain than the $TE_{00}$ mode). Even under such circumstances, however, the $TE_{01}$ mode is always more loss than the $TE_{00}$ mode. Thus, conventional wisdom would predict that it is not possible to make the field strength of the $TE_{01}$ mode comparable to that of the $TE_{00}$ mode. To understand how such field strength levels of the $TE_{01}$ mode are achieved, consider the diffraction (or refraction) of the $TE_{00}$ mode into the $TE_{01}$ mode. The following discussion, based upon a theoretical model believed to be reliable, is provided for pedagogical purposes only and is not intended to limit the scope of the invention as claimed.

As a filament begins to form, it causes the refractive index across the width of the waveguide to be non-uniform. More specifically, the index is lower in the lasing filament regions than in the dark non-filament regions. Imagine now a $TE_{00}$ mode propagating along the waveguide and encountering such a non-uniform index profile. The side of the $TE_{00}$ mode that encounters the lower index region speeds up with respect to the opposite side that encounters the higher index region. Consequently, the phase front of the $TE_{00}$ mode is warped, and the direction of its propagation is altered from a path that is straight down the longitudinal axis to a path that bends across that axis. Further along the waveguide the opposite side of the $TE_{00}$ mode experiences a comparable effect but the bending is reversed. The result is that the propagating mode meanders back and forth across the waveguide. This side to side bending of the $TE_{00}$ mode represents a conversion of the radiation from the $TE_{00}$ mode into the $TE_{01}$ mode by the uniform refractive index profile across the waveguide. This conversion from $TE_{00}$ mode to $TE_{01}$ mode increases the relative field strength of the $TE_{01}$, mode to much larger levels than would have been otherwise possible without the filament and its index gradient-inducing effect. However, the field can not build up in the $TE_{01}$, mode indefinitely. When too much energy is transferred from the $TE_{00}$ into the $TE_{01}$, mode, the filament becomes less and less sinusoidal (e.g., see the cusp-like intensity distribution shown in FIG. 6 for the case where the $TE_{01}$ mode field strength grows to about 150% of the $TE_{00}$ mode field strength), the diffraction efficiency for converting energy from the $TE_{00}$ mode into the $TE_{01}$ mode decreases, and the conversion process slows down to a point that the natural losses of the $TE_{01}$ mode balance the energy converted by diffraction (or refraction) from the $TE_{00}$ mode.

The length of the spatial beat is essentially the same for a filament at any frequency because this parameter is controlled by the difference in effective refractive indices between the $TE_{01}$ and $TE_{00}$ modes, and this difference changes negligibly over the range of frequencies of interest here. The essentially straight line relationships between frequency and propagation constant $k_z$ in FIG. 4 are evidence that this effect is negligible. Therefore, if filaments at two or more frequencies were to form concurrently, they would not interfere with the time-averaged spatial pattern formation or with optical detection function.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, optical storage apparatus in accordance with the invention is also applicable to a storage medium which has bit marks on both sides of the medium (e.g., disk), in which case separate lasers and sensors would be positioned on opposite sides of the medium. In addition, it will be apparent that in optical microscope applications, the objects of different reflectivity might be different regions of an integrated circuit (e.g., a metal region and dielectric region). Moreover, as described in the next section, another embodiment of the invention is a photodetector for use in an optical communication system.

Optical Communication System

Figure 3:
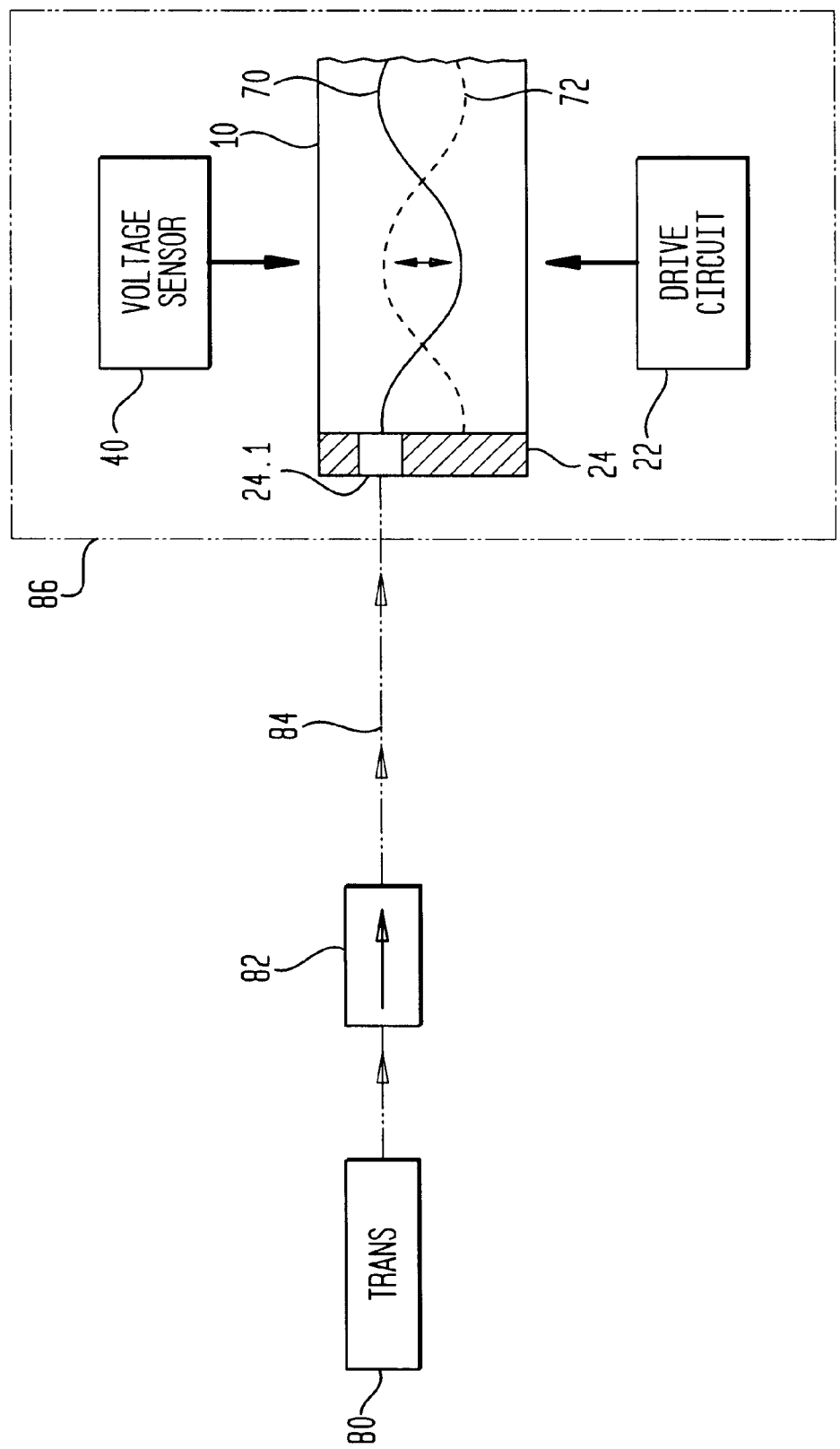
FIG. 3 is a schematic, block-diagrammatic view of an optical communication system in accordance with another embodiment of the invention.

Optical detection apparatus in accordance with another embodiment of the invention finds application as a photodetector in an optical communication system of the type depicted in FIG. 3. In this embodiment, however, radiation injected into the facet feature need not be reflected from on object; instead, it typically originates from an external optical source, such as an optical transmitter. For example, an optical transmitter 80 generates a digital optical signal that is coupled via a transmission medium 84 (e.g., an optical fiber) to an optical receiver 86. The receiver 86 includes optical detection apparatus 10 of the type previously described; e.g., it includes a solid state laser 10 having an output facet 24 and an off-center facet feature 24.1. The laser operates in one of two filament states as previously described. The laser's impedance in each of these states is reflected in its terminal voltage which is detected by sensor 40.

In this embodiment, the transmitted signal has different intensity levels; e.g., it may be a digital signal in which a logic 1 pulse has one intensity and a logic 0 state has a different intensity. This signal is injected into the laser through the facet feature 24.1 and causes that laser to operate in one filament state or the other depending its intensity; e.g., a logic 1 pulse may cause the laser to be in a fixed-filament state, whereas logic 0 pulse may cause the laser to be in a switching filament (or suppressed filament) state.

Preferably the wavelength of the signal injected into the laser should be within the gain spectrum of the laser's active medium.

As is well known in the art, isolator 82 may be incorporated into the system in those cases where the output of the laser might be coupled into the transmitter and cause it (i.e., its own laser) to become unstable.

Inasmuch as the linewidth of a filament is on the order of 100s of GHz, filaments tend to form themselves at the same speed. It is therefore expected that filament-based optical detection in accordance with this embodiment of the invention will likewise take place at speeds on the order of 100s of GHz.

What is claimed is:

1. Optical detection apparatus responsive to the difference in reflectivity between different objects comprising a solid state laser including an intracavity optical waveguide in which laser radiation propagates, an output face from which a portion of said radiation emerges to form a laser output, said waveguide supporting a lasing filament that has at least two orientations within said waveguide, and at least one structural feature disposed on said output face, said feature having a reflectivity different from the surrounding regions of said output face, a controller for sequentially positioning said objects and said laser relative to one another so that said objects are proximate said feature, objects of one reflectivity causing said laser to operate in a first state in which said filament has a single, fixed one of said orientations, and objects of a different reflectivity causing said laser to operate in a second state in which said filament switches between said two orientations or is suppressed, and a sensor responsive to a parameter of said laser that is dependent on the state in which said laser is operating, thereby to sense said objects.

2. The invention of claim 1 wherein said waveguide is planar and supports a multiplicity of transverse modes and said feature mixes the energy of at least two of said modes, thereby generating said filament.

3. The invention of claim 2 wherein said waveguide supports a multiplicity of TE modes.

4. The invention of claim 3 wherein said transverse modes include a fundamental mode component and a higher order mode component that oscillate at the same frequency and are coupled to one another to form said filament.

5. The invention of claim 4 wherein said mode components are TE mode components parallel to the plane of said waveguide.

6. The invention of claim 1 wherein said waveguide has a longitudinal axis and said at least one feature comprises a single feature positioned on said output face off-center with respect to said axis.

7. The invention of claim 1 wherein said waveguide has a longitudinal axis and said at least one feature comprises a pair of features positioned on said output face on opposite sides of said longitudinal axis.

8. The invention of claim 7 wherein said objects comprise a plurality of bit marks in a storage medium, adjacent bit marks being separated by a distance d and said features being separated approximately by a distance D=nd, where n is and integer.

9. The invention of claim 1 wherein said laser includes a resonator formed by a pair of essentially parallel surfaces, and said scattering means includes a coating on at least one of said surfaces, said coating having at least one feature therein for scattering radiation.

10. The invention of claim 1 wherein said feature has higher reflectivity than the surrounding areas of said output face.

11. The invention of claim 1 wherein said feature has lower reflectivity than the surrounding areas of said output face.

12. The invention of claim 1 wherein said controller positions said laser so that said objects are within the near-field region of said laser.

13. Optical storage apparatus for reading a plurality of bit marks contained in a storage medium, each of said bit marks having one of two different reflectivities, comprising a solid state laser including
an optical cavity resonator having a longitudinal axis,
an active medium disposed within said resonator,
means for applying pumping energy to said active medium so as to generate lasing radiation within said resonator, an output face from which a portion of said radiation emerges from said resonator to form a laser output,
an intracavity planar waveguide for guiding said radiation, said waveguide supporting a multiplicity of transverse electric modes, a feature disposed on said output face off-center with respect to said axis, said feature being effective to mix the energy between two of said transverse modes having the same optical frequency, thereby to form an optical filament that has two orientations within said waveguide, a controller for sequentially positioning said laser and said bit marks relative to one another so that said bit marks are proximate said feature and within the near-field region of said laser, a bit mark ot one reflectivity causing said laser to operate in a first state in which said filament is fixed in one of said orientations, and a bit mark of a different reflectivity causing said laser to operate in a second state in which said filament switches between said two orientations or is suppressed said laser having a different terminal voltage in each of said states, and a sensor responsive to said terminal voltage, thereby to sense said marks.

14. An optical detector comprising a solid state laser including an intracavity optical waveguide in which laser radiation propagates, an output face from which a portion of said radiation emerges to form a laser output, said waveguide supporting a lasing filament that has at least two orientations within said waveguide, and at least one structural feature disposed on said output face, said feature having a reflectivity different from the surrounding regions of said output face and being adapted to allow external radiation to be injected into said laser, said radiation having at least two different intensity levels, radiation at one of said levels causing said laser to operate in a first state in which said filament has a single, fixed one of said orientations, and radiation at another of said levels causing said laser to operate in a second state in which said filament switches between said two orientations or is suppressed, and a sensor responsive to a parameter of said laser that is dependent on the state in which said laser is operating, thereby to sense said filaments.

15. The invention of claim 14 wherein the wavelength of said external radiation is within the gain spectrum of said laser.

16. An optical communication system comprising a transmitter for generating an optical signal, a receiver for detecting said signal, characterized in that said receiver includes an optical detector according to claim 14 for detecting said signal.

17. The invention of claim 16 wherein said transmitter generates a digital optical signal that includes optical pulses of different intensity corresponding to first and second logic states, a pulse corresponding to said first logic state causing said laser to operate in said first state in which said filament has a single, fixed one of said orientations, and a pulse corresponding to said second logic state causing said laser to operate in said second state in which said filament switches between said two orientations or is suppressed.

* * * * *